United States Patent
Soper

(10) Patent No.: US 6,807,661 B2
(45) Date of Patent: Oct. 19, 2004

(54) CORRECTING A MASK PATTERN USING A CLIP MASK

(75) Inventor: Robert A. Soper, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 10/386,286

(22) Filed: Mar. 10, 2003

(65) Prior Publication Data

US 2004/0181767 A1 Sep. 16, 2004

(51) Int. Cl.[7] .............................................. G06F 17/50
(52) U.S. Cl. ............................. 716/19; 716/21; 430/5; 430/311; 430/319; 430/394
(58) Field of Search .......................... 716/19–21; 430/5, 430/311, 319, 394

(56) References Cited

U.S. PATENT DOCUMENTS

| | | | | |
|---|---|---|---|---|
| 6,309,800 B1 | * | 10/2001 | Okamoto | 430/311 |
| 6,553,558 B2 | * | 4/2003 | Palmer et al. | 716/19 |
| 6,596,444 B2 | * | 7/2003 | Buck | 430/5 |
| 6,620,561 B2 | * | 9/2003 | Winder et al. | 430/5 |
| 2002/0076624 A1 | * | 6/2002 | Buck | 430/5 |
| 2002/0160278 A1 | * | 10/2002 | Winder et al. | 430/5 |
| 2003/0074646 A1 | * | 4/2003 | Kotani et al. | 716/19 |
| 2003/0165749 A1 | * | 9/2003 | Fritze et al. | 430/5 |

* cited by examiner

Primary Examiner—Vuthe Siek
(74) Attorney, Agent, or Firm—Peter K. McLarty; W. James Brady, III; Frederick J. Telecky, Jr.

(57) ABSTRACT

Correcting a mask pattern includes partitioning the mask pattern to yield templates. The following is repeated for each template to generate correction data: a clip mask is generated for a template selected as a main template; the main template is merged with context templates to yield a merged template; the merged template is divided to yield segments including clip segments, where an intersection of the clip mask and the merged template defines an endpoint of a clip segment; a proximity correction procedure is performed on the segments to yield a corrected template; and correction data of the corrected template is selected according to the clip mask. The correction data for the templates are aggregated to correct the mask pattern.

23 Claims, 2 Drawing Sheets

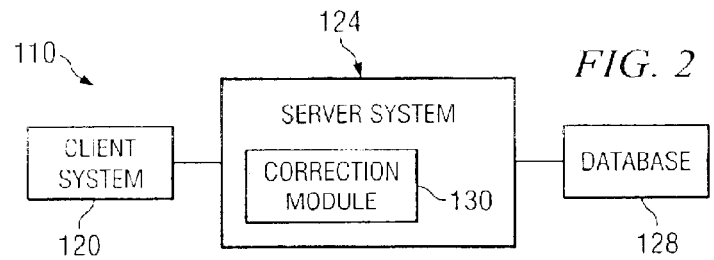
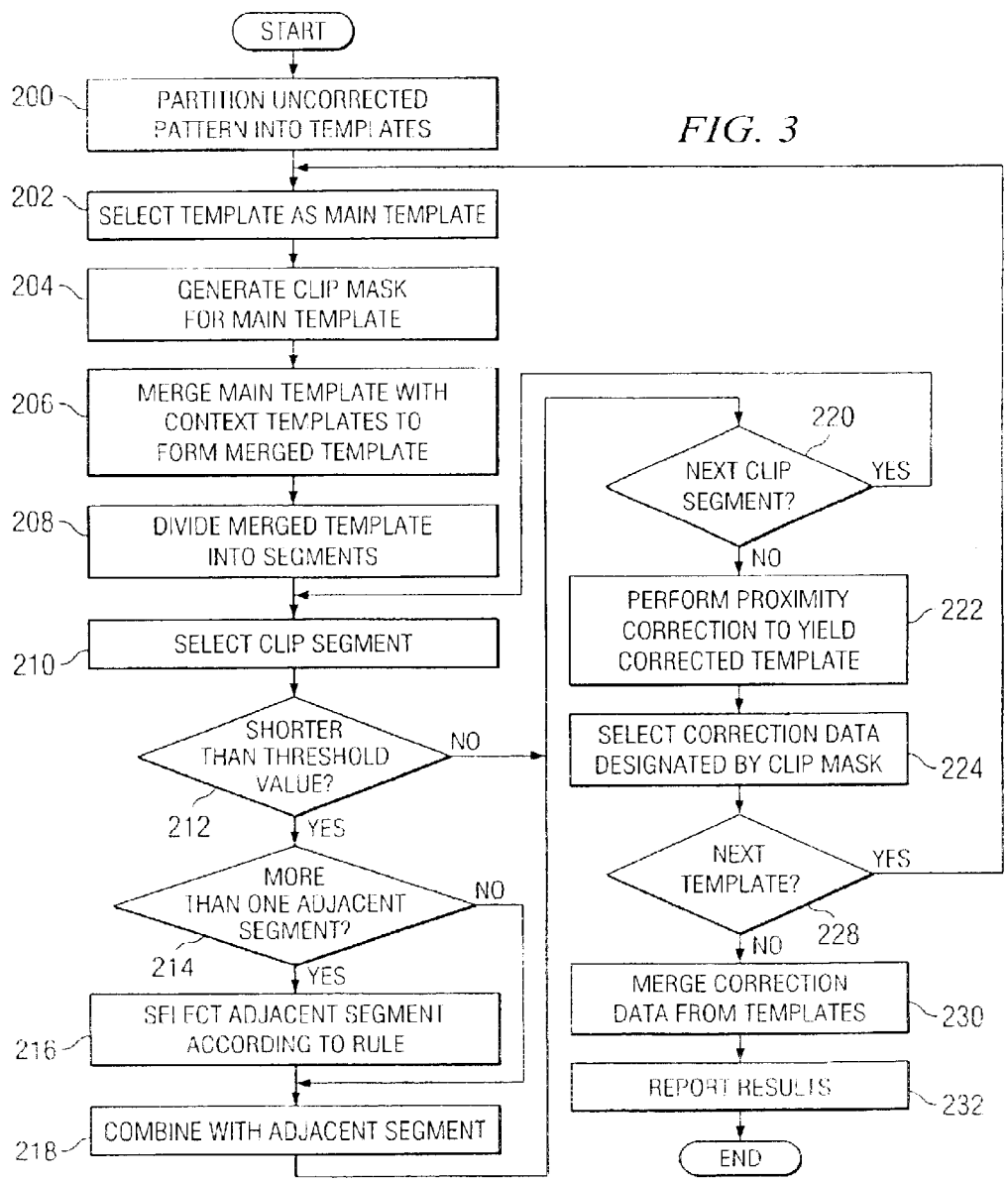

CORRECTING A MASK PATTERN USING A CLIP MASK

BACKGROUND OF THE INVENTION

Masks such as photomasks are typically used in photolithographic systems to define patterns on objects such as integrated circuits. The shape of the mask, however, may sometimes differ from the pattern defined on the object. For example, optical diffraction may cause a resulting pattern defined on an integrated circuit to differ from the shape of the mask. Consequently, masks are typically adjusted to account for these deviations.

SUMMARY OF THE INVENTION

In accordance with the present invention, disadvantages and problems associated with previous techniques for correcting a mask pattern may be reduced or eliminated.

According to one embodiment of the present invention, correcting a mask pattern includes partitioning the mask pattern to yield templates. The following is repeated for each template to generate correction data: a clip mask is generated for a template selected as a main template; the main template is merged with context templates to yield a merged template; the merged template is divided to yield segments including clip segments, where an intersection of the clip mask and the merged template defines an endpoint of a clip segment; a proximity correction procedure is performed on the segments to yield a corrected template; and correction data of the corrected template is selected according to the clip mask. The correction data for the templates are aggregated to correct the mask pattern.

Certain embodiments of the invention may provide one or more technical advantages. A technical advantage of one embodiment may be that a template is divided into segments that include clip segments formed by intersections of a clip mask and the template. Short clip segments are aligned with adjacent segments to generate longer segments. By forming clip segments along the intersections and by generating longer segments from short clip segments, very small corrections that violate a minimum correction threshold may be avoided.

Certain embodiments of the invention may include none, some, or all of the above technical advantages. One or more other technical advantages may be readily skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 2 is a block diagram illustrating one embodiment of a system for correcting a mask pattern; and FIG. 3 is a flowchart illustrating one embodiment of a method for correcting a mask pattern.

DETAILED DESCRIPTION OF THE DRAWINGS

Figure 1:
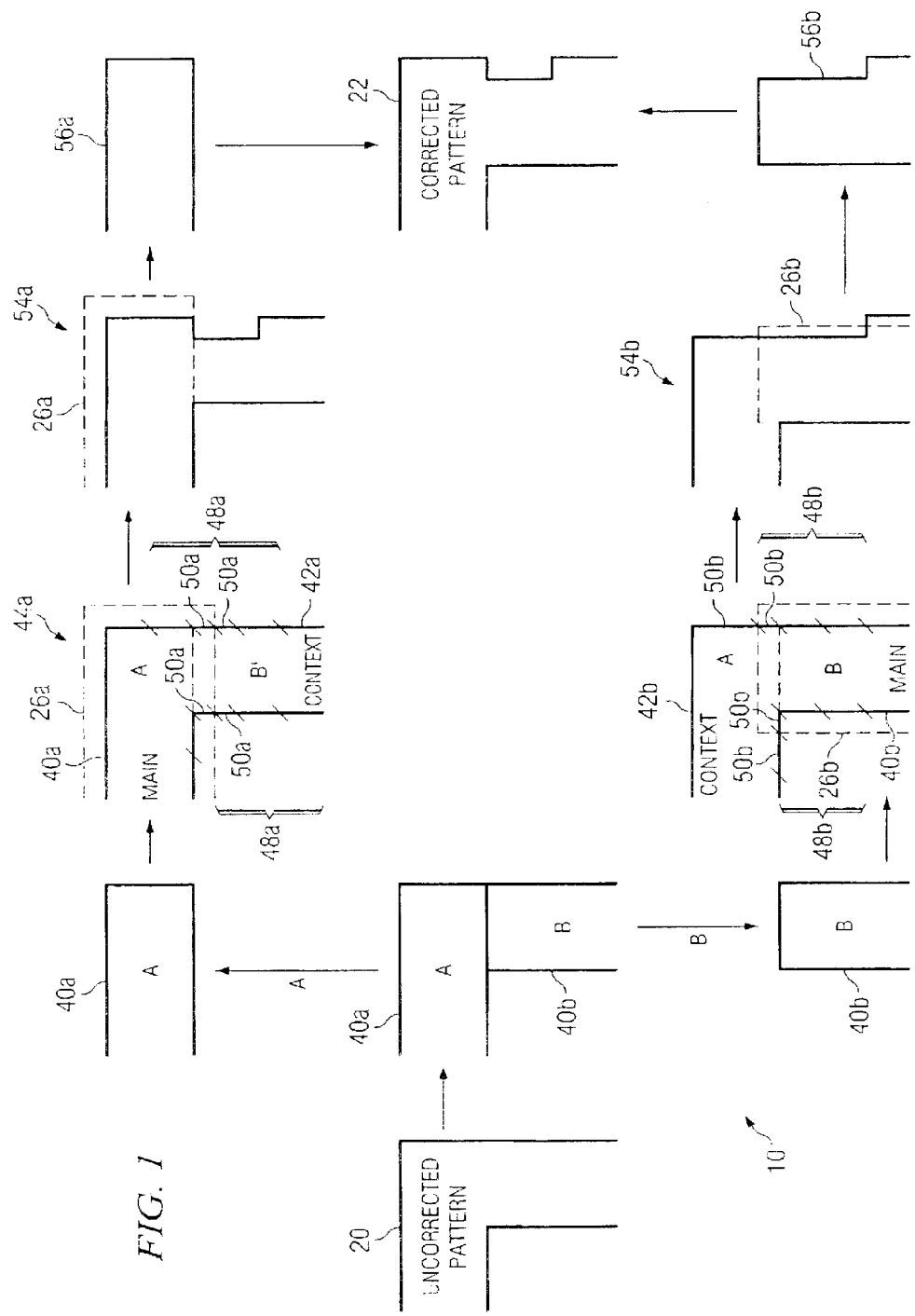
FIG. 1 is a diagram illustrating one embodiment of correction of a mask pattern.

Embodiments of the present invention and its advantages are best understood by referring to FIGS. 1 through 3 of the drawings, like numerals being used for like and corresponding parts of the various drawings.

FIG. 1 is a diagram 10 illustrating one embodiment of correction of a mask pattern. In general, a mask pattern such as a photomask is partitioned to yield templates. The templates are corrected by generating a clip mask for each template and dividing each template into segments. "Each" as used in this document refers to each member of a set or each member of a subset of a set. The segments include clip segments, each of which is formed from an intersection of the clip mask with the template. A clip segment may be relatively short, so a short clip segment may be combined with an adjacent segment to yield a longer segment. Proximity correction is performed on the segments to yield corrected templates, which are aggregated to correct the mask pattern. By forming clip segments from intersections of the clip mask with the template and by combining short clip segments with adjacent segments to generate longer segments, very small corrections that violate a minimum correction threshold may be avoided.

The mask pattern may comprise, for example, all or a portion of any suitable photomask such as a binary mask, an attenuated mask, an alternating phase mask, or any other photomask suitable for defining a desired pattern on an integrated circuit. The mask pattern may have critical dimensions. A critical dimension is a dimension that may be required to be defined with a high degree of accuracy. For example, a mask pattern that defines a transistor gate may have the width of the gate as a critical dimension. The width may be required to be defined with an accuracy of, for example, approximately one nanometer.

Referring to FIG. 1, diagram 10 illustrates correcting an uncorrected pattern 20 to generate a corrected pattern 22 that yields a desired pattern on an object such as an integrated circuit. Uncorrected pattern 20 represents a mask pattern for that has not been corrected. Uncorrected pattern 20 may be corrected for deviations that may occur during the manufacturing process of an integrated circuit. Deviations may result from, for example, optical diffraction, etch effects, mask making errors, resist effects, or other effects occurring during the manufacturing process. To compensate for these deviations, uncorrected pattern 20 is adjusted to yield corrected pattern 22.

To generate corrected pattern 22, uncorrected pattern 20 is partitioned into templates 40a–b, labeled "A" and "B". If pattern correction software cannot efficiently process polygons of an uncorrected pattern, the polygons are typically partitioned into rectangular templates. Each template 40a–b is corrected separately, and the results are aggregated to form corrected pattern 22.

The context proximate to a template, which may be represented by one or more adjacent templates, is taken into account to provide more accurate correction of the template. In the illustrated example, a main template 40a–b is the template undergoing correction, and a context template 42a–b is a template representing the context of main template 40a–b. Main template 40a–b is merged with one or more context templates 42a–b to yield a merged template 44a–b. In the illustrated example, main template A is merged with a context template B'. A proximity correction procedure is performed on merged template 44a–b to yield correction data. A clip mask 26a–b is generated for each main template 40a–b to designate correction data that is selected from merged template 44a–b to form corrected pattern 22. For example, for template A, the data defined within clip mask 26a, but not outside of clip mask 26a, is selected to form corrected pattern 22.

Merged template 44a–b is divided into segments 48a–b to perform the proximity correction procedure. A correction for each segment is be computed individually, and the position of each segment is individually adjusted according to the correction. A clip segment 50a–b comprises a segment 48a–b formed by segmenting merged template 44a–b at an intersection of clip mask 26a–b with merged template 44a–b, such that at least one endpoint of clip segment 50a–b comprises the intersection.

Clip segments 50a–b may be shorter than a predetermined length threshold, and may yield corrected pattern 22 that violates a mask rule. According to one embodiment, the length threshold may be within a range of approximately 50 to 100 nanometers. A mask rule may require that, for example, the size of the features of corrected pattern 22 satisfy a minimum size threshold. The minimum size threshold may correspond to the size of features that can be printed on a mask. Aggregating templates according to other methods may result in features such as tabs or notches that are too small to be printed on the mask, that is, features that violate the mask rule. Moving a short clip segment 50a–b may also yield features that violate the mask rule. To reduce the likelihood of such features, short clip segments 50a–b are combined with an adjacent segment 48a–b to yield a longer segment 48a–b that satisfies the length threshold. The longer segment 48a–b is moved as a whole, that is, short clip segment 50a–b is not moved separately from the adjacent segment 48a–b.

If a short clip segment 50a–b has multiple adjacent segments 48a–b, an adjacent segment 48a–b may be selected according to a rule. For example, a rule may designate that an adjacent segment 48a–b that defines an important feature such as a gate or transistor is selected. A rule may specify that an adjacent segment 48a–b associated with a critical dimension or with a more restrictive critical dimension is selected. Another rule may designate that an adjacent segment 48a–b that is associated with main template 40a–b is selected over an adjacent segment 48a–b associated with context template 42a–b. The rules may be organized in a hierarchy such that if a first rule cannot distinguish between adjacent segments 48a–b, a second rule may be applied.

A proximity correction procedure such as an optical proximity correction (OPC) is performed on segments 48a–b of merged template 44a–b to yield a corrected template 54a–b. Proximity correction may be performed using, for example, optical proximity correction software such as PROTEUS software by SYNOPSYS INCORPORATED. A correction is individually computed for each segment 48a–b, and each segment 48a–b of merged template 44a–b is individually adjusted to form corrected template 54a–b. Corrected segments 48a–b may be snapped to an abstract grid that defines possible positions of the corrected segments 48a–b. The abstract grid may be defined by intervals of, for example, approximately one to five nanometers. Correction data 56a–b to be aggregated to form corrected pattern 22 is selected in accordance with clip mask 26a–b.

Diagram 10 illustrates one embodiment of mask pattern correction that reduces rule violations resulting from separately correcting templates 40a–b and aggregating the correction data. The rule violations may be avoided by generating clip segments 50a–b from the intersections of clip mask 26a–b and merged template 44a–b, and then by combining short clip segments 50a–b with adjacent segments 48a–b to form longer segments. The longer segments are moved to avoid generating small corrections that violate a minimum size threshold.

FIG. 2 illustrates one embodiment of a system 110 for correcting a mask pattern. According to the illustrated embodiment, system 110 includes a client system 120, a server system 124, and a database 128 coupled as shown in FIG. 1.

According to one embodiment, client system 120 allows a user to communicate with a server system 124 to correct a mask pattern. Server system 124 manages applications that correct a mask pattern such as a correction module 130. Correction module 130 generates clip segments 50a–b from the intersections of clip mask 26a–b and merged template 44a–b, and then combines short clip segments 50a–b with adjacent segments 48a–b to form longer segments. The longer segments are moved to avoid generating small corrections that violate a minimum size threshold. An example of a method that may be performed by correction module 130 is presented with reference to FIG. 3.

Client system 120 and server system 124 may each operate on one or more computers and may include appropriate input devices, output devices, mass storage media, processors, memory, or other components for receiving, processing, storing, and communicating information according to the operation of system 11. As used in this document, the term "computer" refers to any suitable device operable to accept input, process the input according to predefined rules, and produce output, for example, a personal computer, work station, network computer, wireless telephone, personal digital assistant, one or more microprocessors within these or other devices, or any other suitable processing device.

Client system 120 and server system 124 may be integrated or separated according to particular needs. For example, the present invention contemplates the functions of both client system 120 and server system 124 being provided using a single computer system, for example, a single personal computer. If client system 120 and server system 124 are separated, client system 120 may be coupled to server system 124 using one or more local area networks (LANs), metropolitan area networks (MANs), wide area networks (WANs), a global computer network such as the Internet, or any other appropriate wire line, wireless, or other links.

Database 128 stores data that may be used by server system 124. Database 128 may be local to or remote from server system 124, and may be coupled to server system 124 using one or more local area networks (LANs), metropolitan area networks (MANs), wide area networks (WANs), a global computer network such as the Internet, or any other appropriate wire line, wireless, or other links. Database 128 may store, for example, a mask pattern that is undergoing correction.

Modifications, additions, or omissions may be made to system 110 without departing from the scope of the invention. Moreover, the operation of the system may be performed by more or fewer modules. For example, the operations of correction module 130 may be performed by more than one module. Additionally, functions may be performed using any suitable logic comprising software, hardware, other logic, or any suitable combination of the preceding.

FIG. 3 is a flowchart illustrating one embodiment of a method for correcting a mask pattern. The method begins at step 200, where uncorrected pattern 20 is partitioned into templates 40a–b. A template 40a is selected as a main template 40a at step 202. Clip mask 26a is generated for main template 40a at step 204. Main template 40a is merged with one or more context templates 42a to form merged template 44a at step 206.

Merged template 44a is divided into segments 48a that include clip segments 50a at step 208. A clip segment 50a is selected at step 210. If clip segment 50a is shorter than a threshold value at step 212, the method proceeds to step 214, where the method determines whether there is more than one adjacent segment 48a. If there is more than one adjacent segment 48a, the method proceeds to step 216, where one of the adjacent segments 48a is selected according to a rule.

The rule may designate, for example, that an adjacent segment 48a that defines main template 40a is selected over an adjacent segment 48a that defines a context template 42a, or that an adjacent segment 48a that designates a feature associated with a critical dimension is selected over an adjacent segment 48a that does not define a feature associated with a critical dimension. The method then proceeds to step 218, where short clip segment 40a is combined with the selected adjacent segment 48a to form a longer segment 48a.

If there is not more than one adjacent segment at step 214, the method proceeds directly to step 218. Short clip segment 50a is combined with adjacent segment 48a to form a longer segment 48a at step 218, and the method proceeds to step 220. If clip segment 50a is not shorter than a threshold at step 212, the method proceeds directly to step 220.

If there is a next clip segment 50a at step 220, the method returns to step 210 to select the next clip segment 50a. If there is no next clip segment 50a at step 220, the method proceeds to step 222. Proximity correction such as optical proximity correction is performed at step 222 to yield corrected template 54a. The proximity correction may be performed on individual segments 48a of merged template 44a to yield corrected template 54a. Longer segment 48a formed by combining short clip segment 50a and adjacent segment 48a is corrected as a whole. Correction data 56a of corrected template 54a is selected as designated by clip mask 26a at step 224.

If there is a next template at step 228, the method returns to step 202 to select the next template 40b as the main template. If there is no next template at step 228, the method proceeds to step 230, where correction data 56a–b from templates 40a–b are aggregated to form corrected pattern 22. Results are reported at step 232. After reporting the results, the method terminates.

Modifications, additions, or omissions may be made to the method without departing from the scope of the invention. Additionally, steps may be performed in any suitable order without departing from the scope of the invention. For example, after aligning short clip segment 50a with adjacent segment 48a at step 218, the method may return to step 212 to determine whether the longer segment formed by short clip segment 50a and adjacent segment 48a satisfies the threshold value.

Certain embodiments of the invention may provide one or more technical advantages. A technical advantage of one embodiment may be that a template is divided into segments that include clip segments formed by intersections of a clip mask and the template. Short clip segments may be aligned with adjacent segments to generate longer segments. By forming clip segments along the intersections and by generating longer segments from short clip segments, very small corrections that violate a minimum correction threshold may be avoided.

Although an embodiment of the invention and its advantages are described in detail, a person skilled in the art could make various alterations, additions, and omissions without departing from the spirit and scope of the present invention as defined by the appended claims.

What is claimed is:

1. A method for correcting a mask pattern, comprising:

partitioning a mask pattern to yield a plurality of templates;

repeating the following for each template of the plurality of templates to generate correction data for the templates:
  selecting a template as a main template;
  generating a clip mask for the main template;
  merging the main template with one or more context templates to yield a merged template;
  dividing the merged template to yield a plurality of segments comprising one or more clip segments, an intersection of the clip mask and the merged template defining an endpoint of a clip segment;
  performing a proximity correction procedure on the segments to yield a corrected template; and
  selecting correction data of the corrected template according to the clip mask; and aggregating the correction data for the templates to correct the mask pattern.

2. The method of claim 1, further comprising:

combining at least one clip segment with an adjacent segment to yield a longer segment; and performing the proximity correction procedure on the longer segment to yield the corrected template.

3. The method of claim 1, further comprising combining at least one clip segment with an adjacent segment to yield a longer segment by:

determining that the at least one clip segment fails to satisfy a length threshold; and combining the at least one clip segment with the adjacent segment to yield the longer segment that satisfies the length threshold.

4. The method of claim 1, further comprising combining at least one clip segment with an adjacent segment to yield a longer segment by:

determining that there are a plurality of adjacent segments; and combining the at least one clip segment with an adjacent segment that is associated with a gate.

5. The method of claim 1, further comprising combining at least one clip segment with an adjacent segment to yield a longer segment by:

determining that there are a plurality of adjacent segments; and combining the at least one clip segment with an adjacent segment that is associated with the main template.

6. The method of claim 1, further comprising combining at least one clip segment with an adjacent segment to yield a longer segment by:

determining that there are a plurality of adjacent segments; and combining the at least one clip segment with an adjacent segment that is associated with a critical dimension.

7. The method of claim 1, further comprising combining at least one clip segment with an adjacent segment to yield a longer segment by:

determining that there are a plurality of adjacent segments; and combining the at least one clip segment with an adjacent segment according to a hierarchy of a plurality of rules.

8. A system for correcting a mask pattern, comprising:
a database operable to store a mask pattern; and
a server coupled to the database and operable to:
partition the mask pattern to yield a plurality of templates;
repeat the following for each template of the plurality of templates to generate correction data for the templates:
select a template as a main template;
generate a clip mask for the main template;
merge the main template with one or more context templates to yield a merged template;
divide the merged template to yield a plurality of segments comprising one or more clip segments, an intersection of the clip mask and the merged template defining an endpoint of a clip segment;
perform a proximity correction procedure on the segments to yield a corrected template; and
select correction data of the corrected template according to the clip mask; and
aggregate the correction data for the templates to correct the mask pattern.

9. The system of claim 8, wherein the server is further operable to:
combine at least one clip segment with an adjacent segment to yield a longer segment; and
perform the proximity correction procedure on the longer segment to yield the corrected template.

10. The system of claim 8, wherein the server is further operable to combine at least one clip segment with an adjacent segment to yield a longer segment by:
determining that the at least one clip segment fails to satisfy a length threshold; and
combining the at least one clip segment with the adjacent segment to yield the longer segment that satisfies the length threshold.

11. The system of claim 8, wherein the server is further operable to combine at least one clip segment with an adjacent segment to yield a longer segment by:
determining that there are a plurality of adjacent segments; and
combining the at least one clip segment with an adjacent segment that is associated with a gate.

12. The system of claim 8, wherein the server is further operable to combine at least one clip segment with an adjacent segment to yield a longer segment by:
determining that there are a plurality of adjacent segments; and
combining the at least one clip segment with an adjacent segment that is associated with the main template.

13. The system of claim 8, wherein the server is further operable to combine at least one clip segment with an adjacent segment to yield a longer segment by:
determining that there are a plurality of adjacent segments; and
combining the at least one clip segment with an adjacent segment that is associated with a critical dimension.

14. The system of claim 8, wherein the server is further operable to combine at least one clip segment with an adjacent segment to yield a longer segment by:
determining that there are a plurality of adjacent segments; and
combining the at least one clip segment with an adjacent segment according to a hierarchy of a plurality of rules.

15. Logic for correcting a mask pattern, the logic embodied in a medium and operable to:
partition a mask pattern to yield a plurality of templates
repeat the following for each template of the plurality of templates to generate correction data for the templates:
select a template as a main template;
generate a clip mask for the main template;
merge the main template with one or more context templates to yield a merged template;
divide the merged template to yield a plurality of segments comprising one or more clip segments, an intersection of the clip mask and the merged template defining an endpoint of a clip segment;
perform a proximity correction procedure on the segments to yield a corrected template; and
select correction data of the corrected template according to the clip mask; and
aggregate the correction data for the templates to correct the mask pattern.

16. The logic of claim 15, further operable to:
combine at least one clip segment with an adjacent segment to yield a longer segment; and
perform the proximity correction procedure on the longer segment to yield the corrected template.

17. The logic of claim 15, further operable to combine at least one clip segment with an adjacent segment to yield a longer segment by:
determining that the at least one clip segment fails to satisfy a length threshold; and
combining the at least one clip segment with the adjacent segment to yield the longer segment that satisfies the length threshold.

18. The logic of claim 15, further operable to combine at least one clip segment with an adjacent segment to yield a longer segment by:
determining that there are a plurality of adjacent segments; and
combining the at least one clip segment with an adjacent segment that is associated with a gate.

19. The logic of claim 15, further operable to combine at least one clip segment with an adjacent segment to yield a longer segment by:
determining that there are a plurality of adjacent segments; and
combining the at least one clip segment with an adjacent segment that is associated with the main template.

20. The logic of claim 15, further operable to combine at least one clip segment with an adjacent segment to yield a longer segment by:
determining that there are a plurality of adjacent segments; and
combining the at least one clip segment with an adjacent segment that is associated with a critical dimension.

21. The logic of claim 15, further operable to combine at least one clip segment with an adjacent segment to yield a longer segment by:
determining that there are a plurality of adjacent segments; and
combining the at least one clip segment with an adjacent segment according to a hierarchy of a plurality of rules.

22. A system for correcting a mask pattern, comprising:
means for partitioning a mask pattern to yield a plurality of templates;
means for repeating the following for each template of the plurality of templates to generate correction data for the templates:

selecting a template as a main template;
generating a clip mask for the main template;
merging the main template with one or more context templates to yield a merged template;
dividing the merged template to yield a plurality of segments comprising one or more clip segments, an intersection of the clip mask and the merged template defining an endpoint of a clip segment;
performing a proximity correction procedure on the segments to yield a corrected template; and
selecting correction data of the corrected template according to the clip mask; and means for aggregating the correction data for the templates to correct the mask pattern.

23. A method for correcting a mask pattern, comprising:

partitioning a mask pattern to yield a plurality of templates;

repeating the following for each template of the plurality of templates to generate correction data for the templates:
  selecting a template as a main template;
  generating a clip mask for the main template;
  merging the main template with one or more context templates to yield a merged template;
  dividing the merged template to yield a plurality of segments comprising one or more clip segments, an intersection of the clip mask and the merged template defining an endpoint of a clip segment;
  combining at least one clip segment with an adjacent segment to yield a longer segment by:
    determining that the at least one clip segment fails to satisfy a length threshold, and combining the at least one clip segment with the adjacent segment to yield the longer segment that satisfies the length threshold; and
    determining that there are a plurality of adjacent segments, combining the at least one clip segment with an adjacent segment according to a hierarchy of a plurality of rules, and combining the at least one clip segment with an adjacent segment that is associated with a member selected from a group consisting of a gate, the main template, and a critical dimension;
  performing a proximity correction procedure on the segments to yield a corrected template; and
  selecting correction data of the corrected ding to the clip mask; and aggregating the correction data for the templates to mask pattern.

* * * * *